(12) United States Patent
Dhindsa et al.

(10) Patent No.: US 8,450,635 B2
(45) Date of Patent: May 28, 2013

(54) METHOD AND APPARATUS FOR INDUCING DC VOLTAGE ON WAFER-FACING ELECTRODE

(75) Inventors: Rajinder Dhindsa, Fremont, CA (US); Alexei Marakhtanov, Fremont, CA (US); Eric Hudson, Fremont, CA (US); Andreas Fischer, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1406 days.

(21) Appl. No.: 12/047,813

(22) Filed: Mar. 13, 2008

(65) Prior Publication Data

US 2008/0237187 A1    Oct. 2, 2008

Related U.S. Application Data

(60) Provisional application No. 60/909,353, filed on Mar. 30, 2007.

(51) Int. Cl.
*B23K 10/00*    (2006.01)

(52) U.S. Cl.
USPC ............ 219/121.36; 219/121.43; 219/121.54; 219/121.59; 118/723 R; 315/111.21; 154/345.44

(58) Field of Classification Search
USPC ............. 219/121.36, 121.43, 121.54, 121.41; 118/723 R, 723 E; 156/345.47, 345.44; 315/111.51, 111.21
See application file for complete search history.

(56) References Cited

U.S. PATENT DOCUMENTS

| | | | |
|---|---|---|---|
| 6,677,711 B2 * | 1/2004 | MacGearailt | 315/111.21 |
| 6,841,943 B2 * | 1/2005 | Vahedi et al. | 315/111.71 |
| 6,984,288 B2 * | 1/2006 | Dhindsa et al. | 156/345.47 |
| 7,276,135 B2 * | 10/2007 | Dhindsa et al. | 156/345.28 |
| 7,632,375 B2 * | 12/2009 | Kuthi et al. | 156/345.1 |
| 2003/0029567 A1 * | 2/2003 | Dhindsa et al. | 156/345.47 |
| 2005/0103442 A1 * | 5/2005 | Chen et al. | 156/345.47 |

FOREIGN PATENT DOCUMENTS

| | | |
|---|---|---|
| JP | 56-90978 A | 7/1981 |
| JP | 56090978 | 7/1981 |
| JP | 56090978 A | 7/1981 |
| JP | 58-158929 | 9/1983 |
| JP | 61-166028 | 7/1986 |
| JP | 2001-185542 | 7/2001 |
| JP | 2006-511059 | 3/2006 |
| KR | 10-2003-0030100 A | 4/2003 |
| KR | 10-2005-0016012 A | 2/2005 |
| KR | 2005/0016012 A | 2/2005 |
| WO | WO-2004/003963 A2 | 1/2004 |

OTHER PUBLICATIONS

"First Office Action", Chinese Patent Application No. 200880010799.5, Mailing Date: Apr. 19, 2011.

(Continued)

*Primary Examiner* — Mark Paschall
(74) *Attorney, Agent, or Firm* — IPSG, P.C. Intellectual Property Law

(57) ABSTRACT

A method for processing a substrate is disclosed. The method includes supporting the substrate in the plasma-processing chamber configured with a first electrode and a second electrode. The method also includes coupling a passive radio frequency (RF) circuit to the second electrode, the passive RF circuit being configured to adjust one or more of an RF impedance, an RF voltage potential, and a DC bias potential on the second electrode.

16 Claims, 5 Drawing Sheets

OTHER PUBLICATIONS

"International Search Report", Issued in PCT Application No. PCT/US2008/058314; Mailing Date: Aug. 29, 2008.

"Written Opinion", Issued in PCT Application No. PCT/US2008/058314; Mailing Date: Aug. 29, 2008.

"International Preliminary Report on Patentability", Issued in PCT Application No. PCT/US2008/058314; Mailing Date: Oct. 15, 2009.

"Search & Examination Report", Issued in Singapore Application No. 200906441-1: Mailing Date: Jan. 20, 2011.

* cited by examiner

METHOD AND APPARATUS FOR INDUCING DC VOLTAGE ON WAFER-FACING ELECTRODE

PRIORITY CLAIM

This application claims priority under 35 USC. 119(e) to a commonly-owned provisional patent application entitled "METHOD AND APPARATUS FOR INDUCING DC VOLTAGE ON WAFER-FACING ELECTRODE", U.S. Application No. 60/909,353, filed on Mar. 30, 2007 by Dhindsa et al, all of which are incorporated herein by reference.

BACKGROUND OF THE INVENTION

Advances in plasma processing have facilitated growth in the semiconductor industry. Plasma processing may involve different plasma generating technologies, for example, inductively coupled plasma processing systems, capacitively-coupled plasma processing systems, microwave generated plasma processing systems and the like. Manufacturers often employ capacitively-coupled plasma processing systems in processes that involve etching and/or depositing of materials to manufacture semiconductor devices.

Next-generation semiconductor devices being fabricated with new advanced materials, complex stacks of dissimilar materials, thinner layers, smaller features, and tighter tolerances may require plasma processing systems with more exact control and wider operating windows for plasma process parameters. Thus, an important consideration for plasma processing of substrates involves capacitively-coupled plasma processing systems possessing capabilities to control a plurality of plasma related process parameters. Prior art methods to control plasma related process parameters may include an external radio frequency (RF) generator or an external DC power source.

To facilitate discussion, FIG. 1 shows a simplified schematic of a prior art plasma processing system 100 with an external RF generator 124 coupled to an upper electrode 104. Plasma processing system 100 may be a single, double (DFC), or triple frequency RF capacitively discharge system. In an example, radio frequencies may include, but are not limited tot 2, 27 and 60 MHz. Plasma processing system 100 may be configured to include a substrate 108 being disposed above a lower electrode 106.

Consider the situation wherein, for example, substrate 108 is being processed. During plasma processing, an RF generator 120 with a path to ground may supply a low RF bias power to lower electrode 106 through an RF match 118. In an example, RF match 118 may be used to maximize power deliver), to the plasma system. The power from RF generator 120 tends to interact with a gas to ignite plasma (the gas and the plasma are not shown to simplify schematic) between upper electrode 104 and lower electrode 106. The plasma may be used to etch and/or deposit materials onto substrate 108 to create electronic devices.

In the example of FIG. 1, lower electrode 106 is electrically isolated from a grounded bottom-extension 114 through a bottom insulator 116. Upper electrode 104 is electrically isolated from a grounded upper outer electrode 110 through an upper insulator 112.

Consider the situation, wherein, for example, a manufacturer may want to adjust the voltage of upper electrode 104 during plasma processing to provide additional control over plasma processing parameters. The voltage of upper electrode 104 may be adjusted by an external generator 124 through an RF match 122 with a path to ground. External generator 124, in the example of FIG. 1, may be a high RF powered generator.

In addition, FIG. 2 shows a simplified schematic of a prior art plasma processing system 200 with an external DC power source 224 connected to an upper electrode 104. Plasma processing system 200 of FIG. 2 is similar to the aforementioned multi-frequency capacitively-couple plasma processing system 100 of FIG. 1.

In the example of FIG. 2, external DC power source 224 is coupled to upper electrode 104 through an RF filter 222 with a path to ground. RF filter 222 is generally used to provide attenuation of unwanted harmonic RF energy without introducing losses to DC power source 224. Unwanted harmonic RF energy is generated in the plasma discharge and may be kept from being returned to the DC power source by RF filter 222.

Consider the situation, wherein, for example, a manufacturer may want to adjust the DC potential of upper electrode 104 during plasma processing to provide additional control over plasma processing parameters. The DC potential of upper electrode 104, in the example of FIG. 2, may be adjusted by employing external DC power source 224.

Unfortunately, the aforementioned plasma processing systems require employing an external RF power supply to change the voltage on an upper electrode or an external DC power supply to change the DC potential on an upper electrode to attain additional control over plasma related parameters. The requirement of external power sources may be expensive to implement and add undesirable operational costs for device manufacturers.

SUMMARY OF INVENTION

The invention relates, in an embodiment, to a method for processing a substrate. The method includes supporting the substrate in the plasma-processing chamber configured with a first electrode and a second electrode. The method also includes coupling a passive radio frequency (RF) circuit to the second electrode, the passive RF circuit being configured to adjust one or more of an RF impedance, an RF voltage potential, and a DC bias potential on the second electrode.

The above summary relates to only one of the many embodiments of the invention disclosed herein and is not intended to limit the scope of the invention, which is set forth is the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
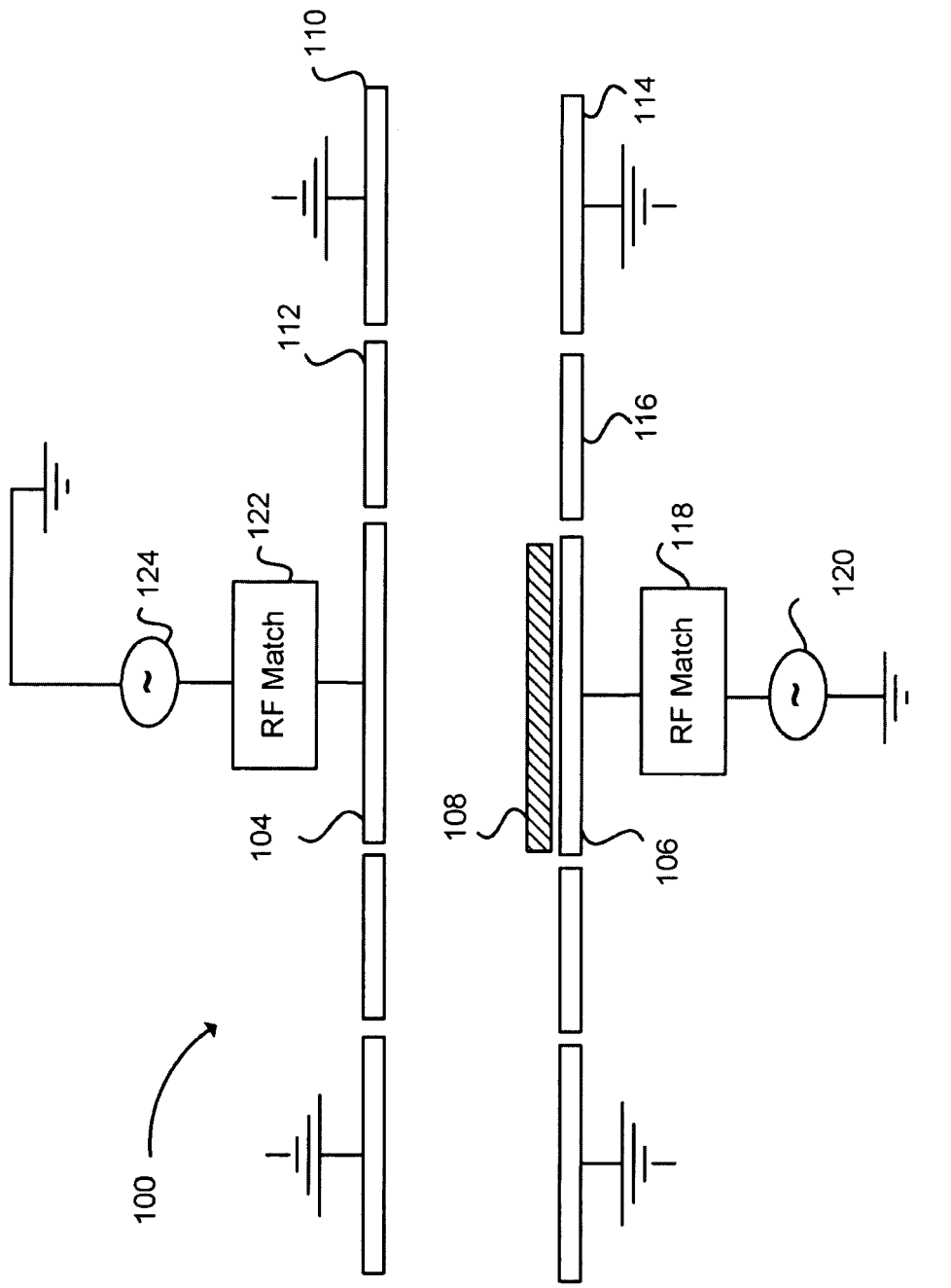
FIG. 1 shows a simplified schematic of a prior art plasma processing system with an external RF generator coupled to an upper electrode.
Figure 2:
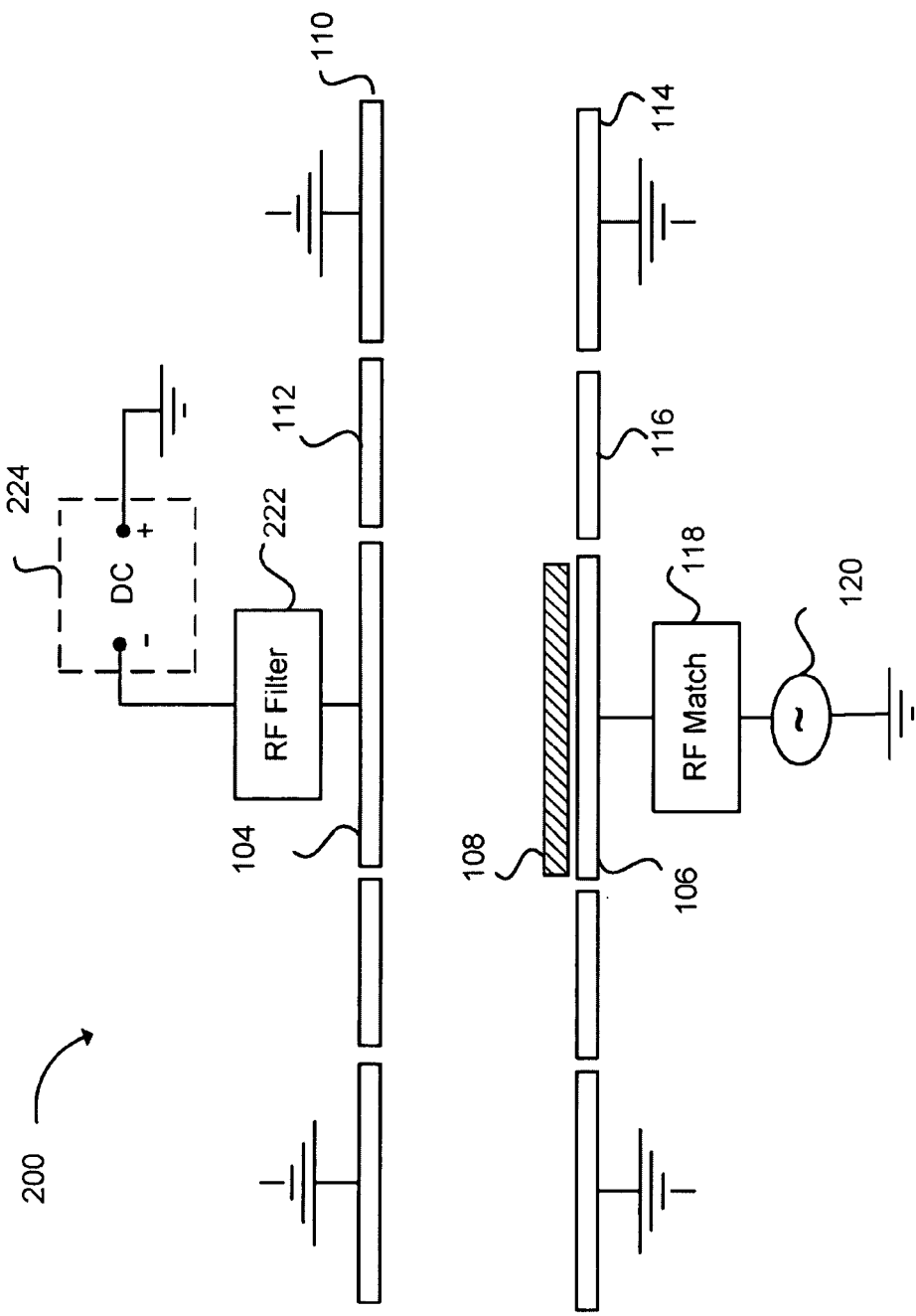
FIG. 2 shows a simplified schematic of a prior art plasma processing system with an external DC power source connected to an upper electrode.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the invention, there are provided methods and arrangements for an RF ground coupling circuit in a plasma processing system to control plasma processing parameters. The RF ground coupling circuit may be connected to an upper electrode with a path to DC ground. Embodiments of the invention enable the RF voltage potential and/or DC bias voltage on the upper electrode to be adjusted with RF ground coupling circuit.

In one or more embodiments of the invention, an RF ground coupling circuit may be employed to control plasma processing parameters (e.g., plasma density, ion energy, and chemistry). The RF ground coupling circuit is a passive circuit. Control may be achieved by generating variable impedance outputs, for example. In another example, control may also be achieved by generating variable resistance.

In an embodiment, a conductive coupling member is employed by the plasma processing chamber to provide a path for DC current return to ground from an upper electrode. In an example, a plasma processing chamber may include an upper electrode coupled to a RF ground coupling circuit. Being connected to the upper electrode, RF ground coupling circuit may be provided with a path for DC current return to ground therefore enabling the RF ground coupling circuit to control RF voltage and/or DC bias on the upper electrode. In another embodiment, the conductive coupling member may have a ring shape to provide radial uniformity for DC current return to ground at the bottom of the plasma processing chamber. In an example, a plasma processing chamber may include a conductive coupling member, which may be a silicon ring disposed above a lower extension ring, to provide radial uniformity for DC current return to ground.

In another embodiment, the RF ground coupling circuit arrangement is configured to provide variable impedance outputs in order to enable adjustment of the RF voltage of the upper electrode. In an example, capacitor(s) and/or inductor(s) may be employed to generate variable impedance outputs. However, other arrangements involving the same and/or different components for generating a variable impedance may also be employed. Unlike the prior art, RF voltage may be controlled without an external RF power generator. Thus, the RF ground coupling circuit arrangement, i.e., a passive circuit, is able to control plasma processing parameters via RF voltage without implementing an expensive external power supply.

In an embodiment, the RF ground coupling circuit arrangement is configured with a variable resistor to allow adjustment of the DC potential of the upper electrode. In an embodiment, the RF ground coupling circuit arrangement does not have an external DC power supply. In an embodiment of the invention, the DC bias of the upper electrode may be controlled by adjusting the resistance value through the variable resistor. Therefore, plasma parameters may be affected by the change in the DC bias of the upper electrode.

Figure 3:
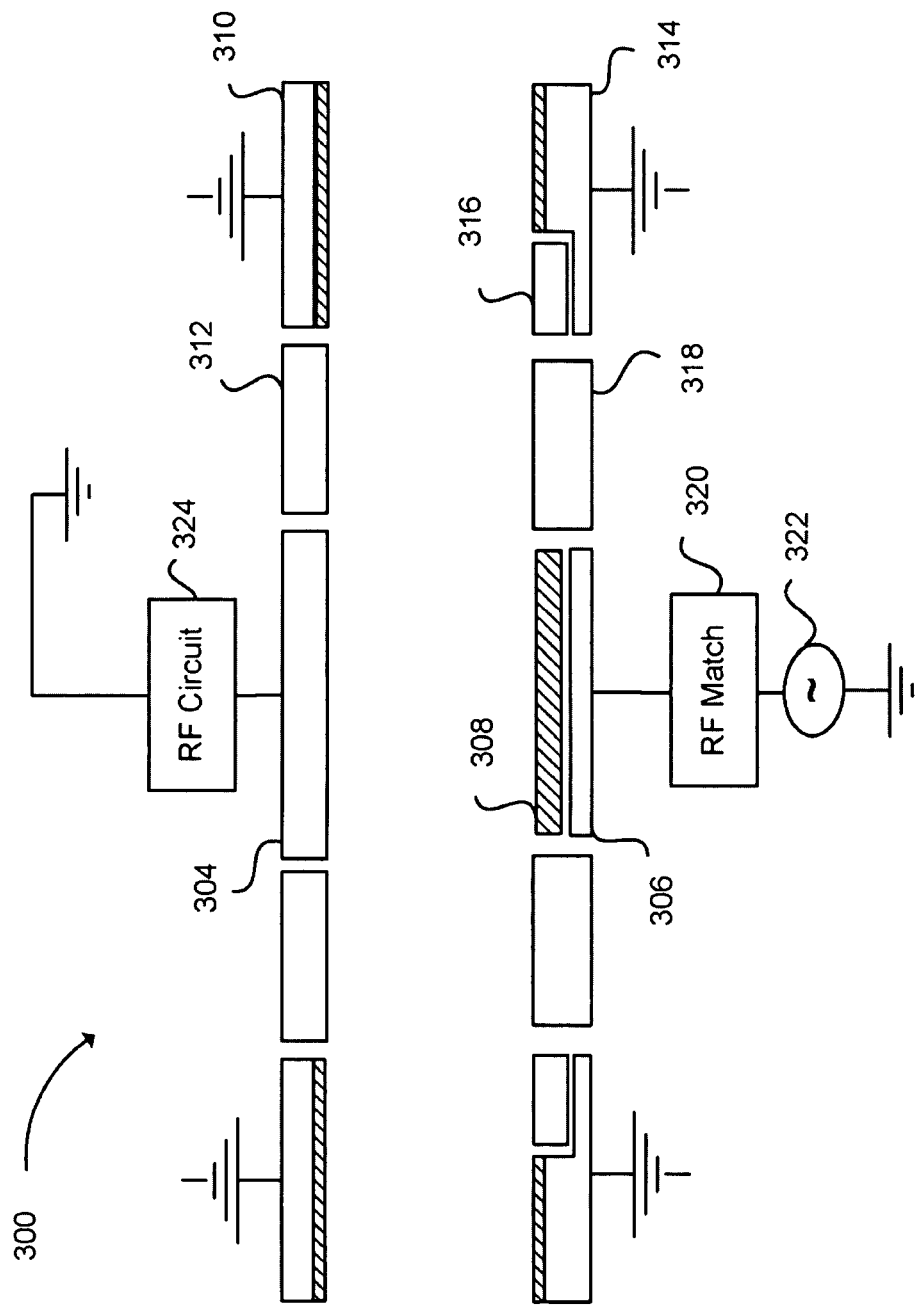
FIG. 3 shows, in accordance with an embodiment of the present invention, a simplified schematic of an RF coupling circuit arrangement coupled to an upper electrode with a path to DC ground in a plasma processing system.

The features and advantages of the invention may be better understood with reference to the figures and discussions that follow. FIG. 3 shows, in accordance with an embodiment of the present invention, a simplified schematic of an RF coupling circuit arrangement 324 coupled to an upper electrode 304 with a path to DC ground in a plasma processing system 300. Plasma processing system 300 may be a single, double, or triple frequency RF capacitively discharge system. In an example, radio frequencies may include, but are not limited to, 2, 27 and 60 MHz. Plasma processing system 300 may be configured to include a substrate 308 being disposed above a lower electrode 306.

Consider the situation wherein, for example, substrate 308 is being processed. During plasma processing, an RF generator 322 with a path to ground may supply low RF bias power to lower electrode 306 through an RF match 320. The RF power from RF generator 320 may interact with a gas to ignite plasma (the gas and plasma are not shown to simplify schematic) between upper electrode 304 and lower electrode 306. Plasma may be used to etch and/or deposit materials onto substrate 308 to create electronic devices.

In the implementation of FIG. 3, upper electrode 304 is electrically isolated by an insulator 312 from a grounded upper extension ring 310. Grounded upper extension 310 may be constructed of a conductive aluminum material that is covered with a quartz layer on the surface.

As shown in FIG. 3, lower electrode 306 is electrically isolated from a DC grounded lower electrode extension ring 314, which is located at the bottom of the plasma processing chamber, by an insulator 318. In the implementation of FIG. 3, lower extension ring 314 may be constructed of conductive aluminum material that may be covered with a quartz layer on the surface. Other conductive materials may also be employed in the construction of lower extension ring 314.

In the prior arts, RF coupling and DC bias to an upper electrode may be achieved by employing external power sources. Unlike prior art methods. RF coupling and DC bias may be achieved by providing a DC current return to ground and a RF coupling circuit arrangement.

In an embodiment of the invention, a conductive coupling member 316 is disposed above the aluminum portion of lower electrode extension ring 314 to provide a path for DC current return to ground. Conductive coupling member 316 may be constructed of silicon. Alternatively conductive coupling member 316 may also be constructed of other conductive materials. In the implementation of FIG. 3, conductive coupling member 316 is a ring shape. The ring shape advantageously provides radial uniformity for DC current return to ground at the bottom of the plasma processing chamber. However, conductive coupling member 316 may be formed into appropriate shape, e.g., a circular disc shape, a doughnut shape and the like, that may provide uniformity for DC current return to ground.

In an embodiment, upper electrode 304 is provided with an RF coupling circuit arrangement 324 that controls the RF coupling to ground. In contrast to prior art examples, RF coupling circuit arrangement 324 does not require an external power supply, i.e., a passive circuit. The RF coupling circuit arrangement 324 may be configured with a circuit to van, the impedance and/or the resistance to change the RF voltage potential and/or the DC bias potential on upper electrode 304 respectively.

Figure 4:
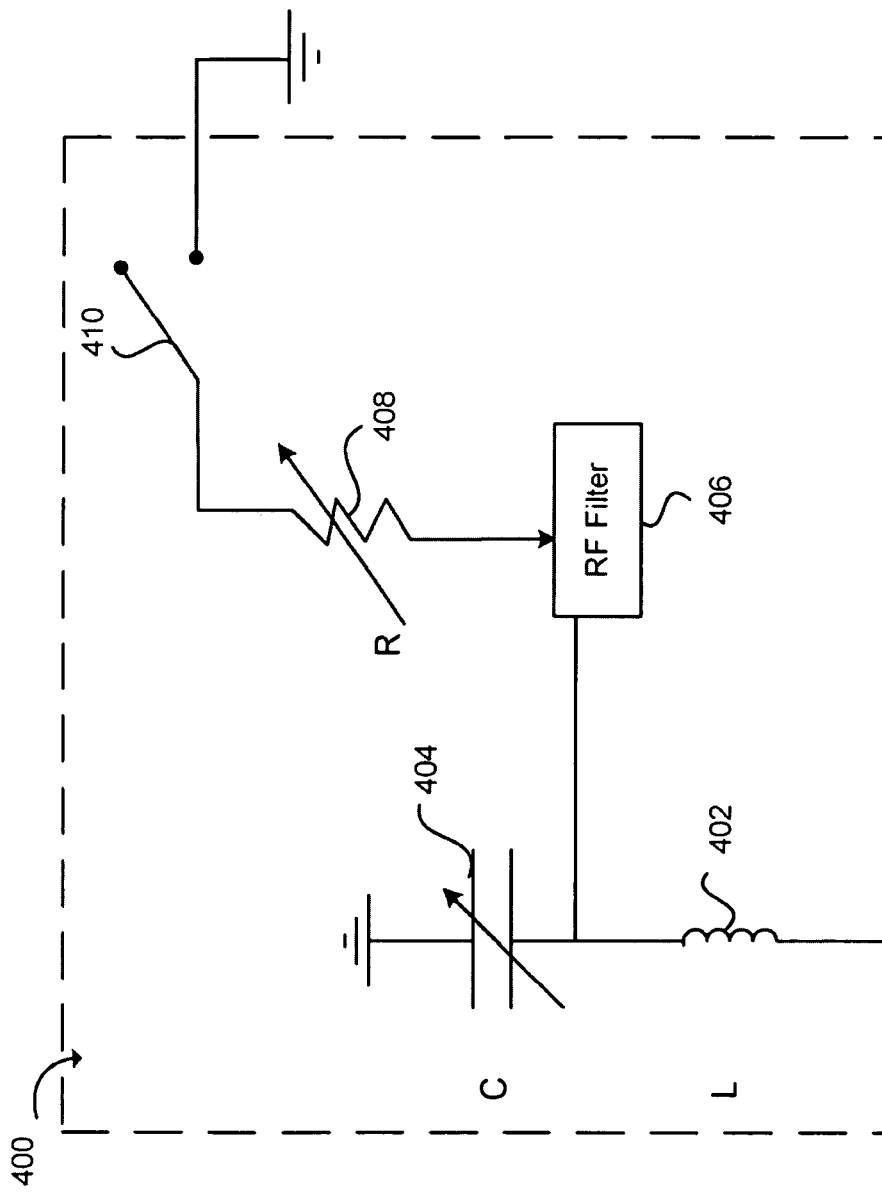
FIG. 4 shows, in accordance with an embodiment of the invention a simplified schematic of an RF coupling circuit arrangement.

FIG. 4 shows, in accordance with an embodiment of the invention, a simplified schematic of an RF coupling circuit arrangement 400. An RF coupling circuit arrangement 400 of FIG. 4 shows the details of RF coupling circuit arrangement 324 of FIG. 3. Therefore, FIG. 4 is discussed in relation to FIG. 3 to facilitate understanding.

In an embodiment of the invention, a variable impedance circuit may be implemented by, for example, capacitor(s) and/or inductor(s) for generating a variable impedance output. However, other arrangements involving the same and/or different components for generating a variable impedance may also be employed. In the implementation of FIG. 4, RF coupling circuit arrangement 400 is configured with an inductor (L) 402 in series with a variable capacitor (C) 404 with a path to ground for generating a variable impedance output. In some embodiments, capacitor 404 may have values, without limitation, between about 20 pF to about 4,000 pF (when frequency is about 2 MHz). In some embodiments, inductor 402 may have a value, without limitation, of about 14 nH.

In an embodiment of the invention, RF coupling circuit arrangement 400 is further configured with an RF filter 406 connected to a variable resistor (R) 408 and a switch 410 for generating a variable resistance output. When switch 410 is set to the opened position, the upper electrode is floating and no current is flowing through the circuit.

When switch 410 is set to the closed position, the current path tends to flow from upper electrode 304 through plasma (not shown) to DC ground lower extension ring 314 via conductive coupling member 316 of FIG. 3, in accordance with an embodiment of the invention. Variable capacitor 404 and inductor 402 may be disposed in the current path thereby providing the impedance to the current flow. The impedance of RF coupling circuit arrangement 400 may be adjusted by changing the value of variable capacitor 404. The RF voltage potential of upper electrode 304 of FIG. 3 may be controlled by changing the impedance through the LC portion of the RF coupling circuit arrangement 400. In contrast to prior art examples, RF coupling circuit arrangement 400 does not require an external power supply.

Furthermore, variable resistor 408 may be disposed in the current path to provide resistance to the current flow. In an example, the resistance of RF coupling circuit arrangement 400 may be adjusted by changing the value of variable resistor 408. Thus, the DC potential of upper electrode 304 of FIG. 3 may be controlled to provide gradation in the DC potential values between DC floating, in which the switch 410 of FIG. 4 is opened, and DC ground, in which switch 410 of FIG. 4 is closed.

Figure 5:
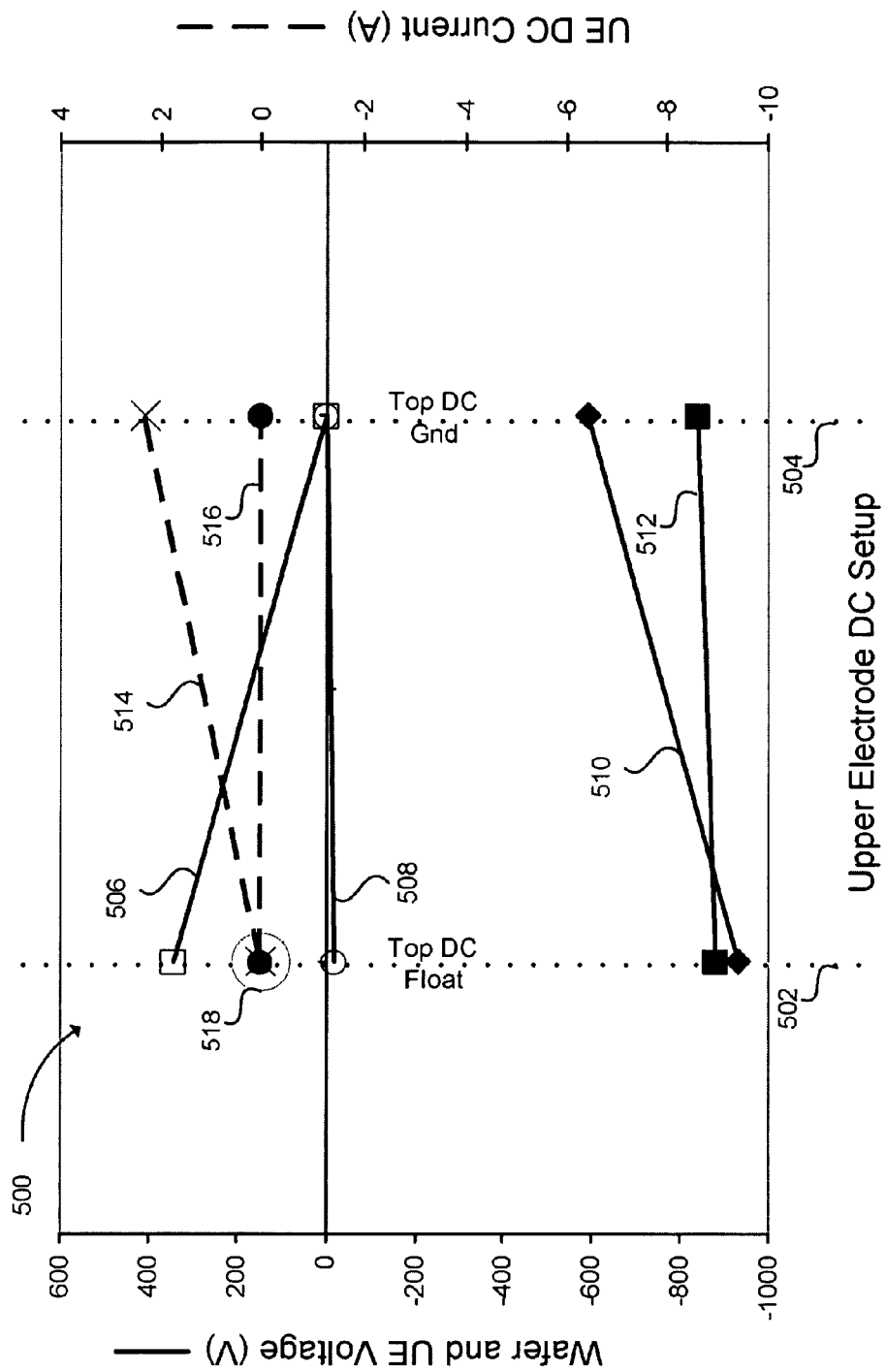
FIG. 5 shows, in accordance with an embodiment of the invention, a graph representing data showing the measured effects of RF coupling circuit arrangement on plasma-related parameters of the plasma processing system at two different capacitance values.

FIG. 5 shows, in accordance with an embodiment of the invention, a graph 500 representing data showing the measured effects of RF coupling circuit arrangement on plasma-related parameters of the plasma processing system at two different capacitance values. FIG. 5 is discussed in relation to FIGS. 3 and 4 to facilitate understanding.

As shown in FIG. 5, the horizontal axis shows the upper electrode DC setup. A dotted line 502 shows a top DC float setup, in which switch 410 of FIG. 4 is opened. A dotted line 504 shows a top DC ground in which switch 410 of FIG. 4 is closed.

In FIG. 5, the left-hand side of the vertical axis shows the wafer DC bias and upper electrode DC voltage potentials measure in voltage (V). There are shown in FIG. 5 plot lines (506, 508, 510, and 512) with solid lines corresponding to voltage values of the left-hand side of the vertical axis. In addition, the right-hand side of the vertical axis shows the upper electrode DC current measures in ampere (A). There are also shown in FIG. 5 plot lines (514 and 516) with dashed lines corresponding to current values of the right-hand side of the vertical axis.

Consider the situation wherein, for example, switch 410 in RF coupling circuit arrangement 400 of FIG. 4 is opened during plasma processing. Upper electrode 304 of FIG. 3 is floating and there is no DC current path. In an example, the measured values for the DC current on upper electrode 304, as illustrated at point 518 for plot lines 514 and 516 of FIG. 5, are substantially zero when switch 410 is opened.

When switch 410 is closed, for example, upper electrode 304 of FIG. 3 is grounded and there is a DC current path, in accordance with an embodiment of the invention. The DC current returns to ground from upper electrode 304 through the plasma to conductive coupling ring 316, which is disposed above the aluminum portion of lower extension 314, in the implementation of FIG. 3. In contrast to prior art, RF coupling with upper electrode 304 may be achieved without employing external power generator.

During plasma processing wherein switch 410 of FIG. 4 is closed, for example, variable capacitor 404 of RF coupling circuit arrangement 400 of FIG. 4 may be adjusted to vary the impedance values. Concurrently or alternatively, variable resistor 408 of FIG. 4 may be adjusted to vary the resistance values.

In an example, variable capacitor 404 may be set to a first capacitance value of 0.8 nano Farad (nF) or a second capacitance value of 10 nF. The measured upper electrode DC voltage potential values at 0.8 and 10 nF capacitance settings are represented by plot lines 506 and 508, respectively. As shown in FIG. 5, plot line 506 with the lower capacitance value of 0.8 nF shows a larger change in DC voltage potential, i.e., a bigger change in slope, in comparison to curve 508 with the larger capacitance value of 10 nF.

In addition, the value of the upper electrode DC voltage potential may be adjusted by changing the resistance value of variable resistor 408. For example, the DC voltage potential value at 0.8 nF capacitance setting of plot line 506 may, be adjusted to any value along the plot line 506 by changing the value of variable resistor 408.

In another example, the wafer DC bias values at 0.8 or 10 nF capacitance settings are represented by plot lines 510 and 512 of FIG. 5, respectively. Plot line 510 with the lower capacitance value of 0.8 nF shows a larger change in DC bias i.e., a bigger change in slope, in comparison to plot line 512 with the larger capacitance value of 10 nF, in accordance with an embodiment of the invention, during plasma processing when switch 410 of FIG. 4 is closed.

Accordingly, the value of the wafer DC bias may be adjusted by changing the resistance value of variable resistor 408. For example, the wafer DC bias value at 0.8 nF capacitance setting of plot line 510 may be adjusted to any value along the plot line 510 by changing the value of variable resistor 408.

In another embodiment, the upper electrode DC current values at 0.8 and 10 nF capacitance settings are represented by plot lines 514 and 516 of FIG. 5, respectively. Plot line 514 with the lower capacitance value of 0.8 nF shows a larger change in DC current i.e., a bigger change in slope, in comparison to curve 516 with the larger capacitance value of 10 nF.

As may be appreciated from the foregoing, embodiments of the invention provide methods and arrangements for controlling plasma process parameters (e.g., plasma density, ion energy, and chemistry) by adjusting the RF impedance and/or the DC bias potential on an upper electrode employing an RF coupling circuit with a DC current path to ground. The RF coupling circuit and the DC ground path are relatively simple to implement. Also, control may be achieved without employing an external DC power supply source. By eliminating the need for an external power source, cost saving may be realized while maintaining control of plasma processing in a capacitively-coupled plasma processing chamber.

While this invention has been described in terms of several preferred embodiments, there are alterations, permutations, and equivalents, which fall within the scope of this invention. Also, the title, summary, and abstract are provided herein for convenience and should not be used to construe the scope of the claims herein. It should also be noted that there are many alternative ways of implementing the methods and apparatuses of the present invention. Although various examples are provided herein, it is intended that these examples be illustrative and not limiting with respect to the invention. Further, in this application, a set of "n" items refers zero or more items in the set. It is therefore intended that the following appended claims be interpreted as including all such alterations, permutations, and equivalents as fall within the true spirit and scope of the present invention.

What is claimed is:

1. In a plasma processing chanter, a method for processing a substrate comprising:
   supporting said substrate in said plasma processing chamber configured with a first electrode and a second electrode;
   providing an extension ring surrounding said first electrode;
   configuring at least one power source coupled to said second electrode to ignite plasma between said first electrode and said second electrode;
   providing a DC ground which includes a conductive coupling member surrounding said first electrode and disposed above said extension ring to provide a path DC current return to ground from said second electrode through said extension ring; and
   coupling a passive radio frequency (RF) ground coupling circuit to said second electrode, said passive RF ground coupling circuit being configured to adjust one or more of an RF impedance, an RF voltage potential, and a DC bias potential on said second electrode to control plasma processing parameters.

2. The method of claim 1, wherein said conductive coupling member is made of silicon.

3. The method of claim 1, wherein said conductive coupling member is shaped as a ring.

4. The method of claim 1, wherein said passive RF ground coupling circuit includes at least one of a capacitor and an inductor.

5. The method claim of 4, wherein said capacitor is a variable capacitor.

6. The method of claim 4, wherein said inductor is a variable inductor.

7. The method of claim 1, wherein said RF ground coupling circuit includes an RF filter arrangement, a resistor and a switch.

8. The method of claim 7, wherein said resistor is a variable resistor.

9. A plasma processing system comprising:
   a first electrode;
   a second electrode;
   an extension ring surrounding, said first electrode;
   at least one power source coupled to said second electrode, said at least one power source being configured to ignite plasma between said first electrode and said second electrode;
   a DC ground which includes a conductive coupling member surrounding said first electrode and disposed above said extension ring to provide a path DC current return to ground from said second electrode through said extension ring; and
   a passive radio frequency (RF) ground coupling circuit coupled to said second electrode, said passive RF ground coupling circuit being configured to adjust one or more of an RF impedance, an RF voltage potential, and a DC bias potential on said second electrode to control plasma procession parameters.

10. The plasma processing system of claim 9, wherein said conductive coupling member is made of silicon.

11. The plasma processing system of claim 9, wherein said conductive coupling member is shaped as a ring.

12. The plasma processing system of claim 9, wherein said passive RF ground coupling circuit includes at least one of a capacitor and an inductor.

13. The plasma processing system claim of 12, wherein said capacitor is a variable capacitor.

14. The plasma processing system of claim 12, wherein said inductor is a variable inductor.

15. The plasma processing system of claim 9, wherein said RF coupling ground coupling circuit includes an RF filter arrangement, a resistor and a switch.

16. The plasma processing system of claim 15, wherein said resistor is a variable resistor.

* * * * *